(12) United States Patent
Graham et al.

(10) Patent No.: US 8,933,535 B2
(45) Date of Patent: Jan. 13, 2015

(54) WAFER WITH SPACER INCLUDING HORIZONTAL MEMBER

(71) Applicant: Robert Bosch GmbH, Stuttgart (DE)

(72) Inventors: Andrew B. Graham, Redwood City, CA (US); Gary Yama, Mountain View, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/868,438

(22) Filed: Apr. 23, 2013

(65) Prior Publication Data

US 2013/0234281 A1 Sep. 12, 2013

Related U.S. Application Data

(62) Division of application No. 13/232,209, filed on Sep. 14, 2011, now Pat. No. 8,426,289.

(60) Provisional application No. 61/475,438, filed on Apr. 14, 2011.

(51) Int. Cl.
*H01L 29/00* (2006.01)
*H01L 29/06* (2006.01)
*H01L 21/768* (2006.01)
(Continued)

(52) U.S. Cl.
CPC ........ *H01L 29/0649* (2013.01); *H01L 21/7682* (2013.01); *H01L 23/4821* (2013.01); *H01L 21/76283* (2013.01); *H01L 21/76232* (2013.01)
USPC ........... 257/522; 257/506; 257/758; 257/774; 257/E21.013; 257/E21.546

(58) Field of Classification Search
CPC ..................... H01L 29/0649; H01L 21/76232; H01L 21/7682; H01L 21/76283; H01L 23/4821
USPC .......... 438/404; 257/758, 774, 506, 522, 510, 257/E29.111, E21.013, E21.546
See application file for complete search history.

(56) References Cited

U.S. PATENT DOCUMENTS

| | | | |
|---|---|---|---|
| 5,117,276 A * | 5/1992 | Thomas et al. | 257/758 |
| 5,350,886 A | 9/1994 | Miyazaki et al. | |
| 5,627,406 A * | 5/1997 | Pace | 257/700 |

(Continued)

OTHER PUBLICATIONS

Van Zeijl et al., LPCVD Silicon Nitride-On-Silicon Spacer Technology, Proc. 20th International Symposium on Microelectronics Technology and Devices, Sep. 4-7, Brazil, 2005 (10 pages).

(Continued)

*Primary Examiner* — Michael Trinh
(74) *Attorney, Agent, or Firm* — Maginot Moore & Beck LLP

(57) ABSTRACT

A method of forming an insulating spacer is disclosed that includes providing a base layer, providing an intermediate layer above an upper surface of the base layer, etching a first trench in the intermediate layer, depositing a first insulating material portion within the first trench, depositing a second insulating material portion above an upper surface of the intermediate layer, forming an upper layer above an upper surface of the second insulating material portion, etching a second trench in the upper layer, and depositing a third insulating material portion within the second trench and on the upper surface of the second insulating material portion. A wafer is also disclosed.

17 Claims, 5 Drawing Sheets

(51) Int. Cl.
*H01L 23/482* (2006.01)
*H01L 21/762* (2006.01)

(56) References Cited

U.S. PATENT DOCUMENTS

| | | | |
|---|---|---|---|
| 5,753,529 A * | 5/1998 | Chang et al. | 438/118 |
| 6,130,151 A | 10/2000 | Lin et al. | |
| 6,664,126 B1 | 12/2003 | Devoe et al. | |
| 6,913,941 B2 | 7/2005 | O'Brien et al. | |
| 7,056,757 B2 | 6/2006 | Ayazi et al. | |
| 7,573,081 B2 * | 8/2009 | Chan et al. | 257/276 |
| 7,790,529 B2 | 9/2010 | Parekh | |
| 7,825,484 B2 | 11/2010 | Martin et al. | |
| 2007/0218616 A1 | 9/2007 | Parekh | |
| 2007/0281488 A1 | 12/2007 | Wells et al. | |
| 2010/0032775 A1 | 2/2010 | Morris, III et al. | |
| 2010/0295138 A1 | 11/2010 | Montanya Silvestre et al. | |

OTHER PUBLICATIONS

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).

Chen et al., "An Integrated Solution for Wafer-Level Packaging and Electrostatic Actuation of Out-Of-Plane Devices," Paper from Stanford University, 2009, pp. 1071-1074, IEEE, USA (4 pages).

Chen, "Electrode Integrated Wafer-Level Packaging for Out-of-Plane MEMS Devices," Abstract Preview, International Microelectronics and Packaging Society, 2009, USA (1 pages).

Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).

Park et al., "Untraminiature encapsulated accelerometers as a fully implantable sensor for implantable hearing aids," Biomed Microdevices, 2007, Springer, USA (11 pages).

Web site publication, "Encapsulation for RF MEMS," http://micromachine.stanford.edu/~kuanlinc/Professional/Encapsulation%20for20%RF%20 . . . Downloaded Apr. 1, 2011, (4 pages).

International Search Report and Written Opinion in corresponding PCT Application (i.e., PCT/US2012/033524), mailed Oct. 1, 2012 (9 pages).

* cited by examiner

US 8,933,535 B2

WAFER WITH SPACER INCLUDING HORIZONTAL MEMBER

This application is a divisional of application Ser. No. 13/232,209, filed on Sep. 14, 2011 (now U.S. Pat. No. 8,426,289), which in turn claims the benefit of U.S. Provisional Application No. 61/475,438, filed Apr. 14, 2011. The disclosures of the two above-identified patent applications are hereby totally incorporated by reference in their entirety.

FIELD OF THE INVENTION

This invention relates to wafers and substrates such as are used in micromechanical electrical system (MEMS) devices or semiconductor devices.

BACKGROUND

Device isolation typically is achieved by utilizing local oxidation of silicon ("LOCOS") or shallow trench isolation ("STI") techniques. In the STI device isolation technique, isolation is typically achieved by forming a recess or trench in a layer that is destined to become two adjacent active areas, and filling the trench with an isolation material. The material in the trench, typically a nitride material, is referred to as a spacer. Nitride spacers, in addition to electrical isolation, may also be used as a fluid barrier.

STI is beneficial in providing higher packing density, improved isolation, and greater planarity, by avoiding the topographical irregularities encountered when using conventional thick film oxide isolation (LOCOS). In particular, the growth of thermal field oxide using a mask, such as nitride, creates an encroachment of the oxide into the active areas; this encroachment is referred to as the bird's beak effect.

High aspect ratio trenches, while theoretically desirable in reducing the footprint of a nitride spacer, present various technical problems. One significant problem is that when depositing nitride to fill a high aspect ratio trench, a vertical seam inherently occurs along the center of the trench, where the outer surfaces of deposited nitride layers on opposing vertical trench walls meet. The vertical seam generally includes gaps in which no nitride material is present. While the gaps may not degrade the electrical isolation function of a nitride spacer, the gaps are problematic in other respects. For example, in fluid barrier applications, the gaps are essentially a short circuit in the isolation capability of the nitride spacer. Moreover, the gaps are flaws which can reduce the material strength of the nitride spacer.

What is needed therefor is a spacer and method of forming a spacer that overcomes one or more problems in known spacers. It would be beneficial if the spacer and method of forming a spacer could include high aspect ratio trench forming processes while providing increased spacer strength. It would be further beneficial if the spacer and method of forming a spacer could include high aspect ratio trench forming processes while providing improved spacer isolation characteristics.

SUMMARY

In one embodiment, a method of forming an insulating spacer includes providing a base layer, providing an intermediate layer above an upper surface of the base layer, etching a first trench in the intermediate layer, depositing a first insulating material portion within the first trench, depositing a second insulating material portion above an upper surface of the intermediate layer, forming an upper layer above an upper surface of the second insulating material portion, etching a second trench in the upper layer, and depositing a third insulating material portion within the second trench and on the upper surface of the second insulating material portion.

In a further embodiment, a wafer includes a base layer, a first layer portion above an upper surface of the base layer, a first trench in the first layer portion, a first insulating material portion within the first trench, a second insulating material portion extending horizontally above an upper surface of the first layer portion and connected to the first insulating material portion, a second layer portion above an upper surface of the second insulating material portion, a second trench in the second layer portion, and a third insulating material portion within the second trench and on the upper surface of the second insulating material portion.

DESCRIPTION

Figure 1:
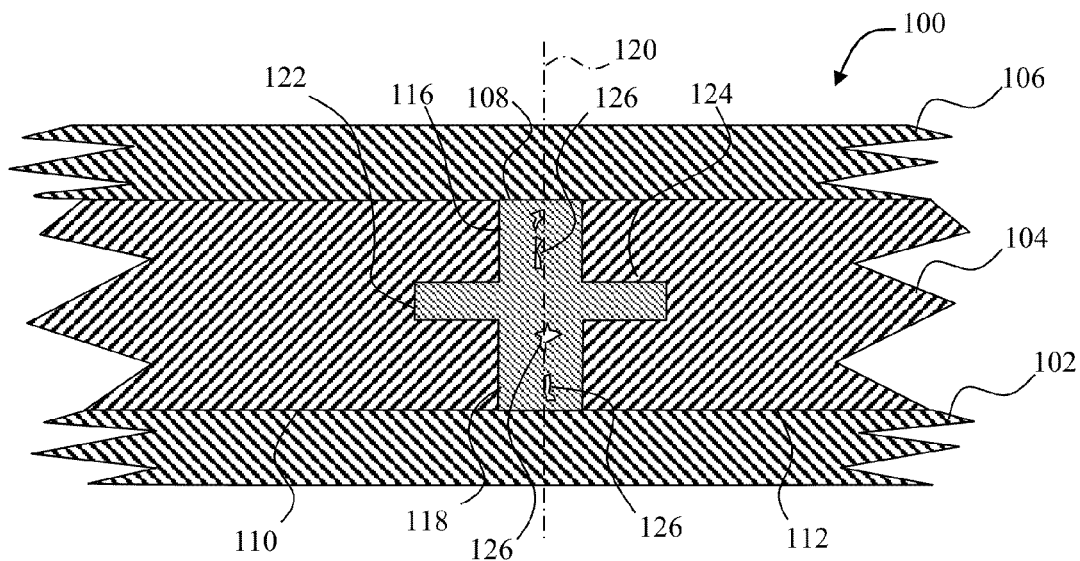
FIG. 1 depicts a partial side cross sectional view of a nitride spacer between adjacent segments of a layer, the nitride spacer having a laterally extending portion at a location between two trench portions in accordance with principles of the invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a wafer 100 which includes a substrate layer 102, a device layer 104, and a cap layer 106. The device layer 104 may comprise silicon or another structural material. A spacer 108, which in this embodiment is a nitride material, divides the device layer 104 into two adjacent layer segments 110/112. The spacer 108 may be used to electrically isolate the adjacent layer segments 110/112 from each other. The spacer 108 may additionally or alternatively be used to isolate the adjacent layer segments 110/112 such that gasses cannot diffuse from one of the layer segments 110/112 to the other of the layer segments 110/112.

The spacer 108 includes two trench portions 116 and 118 which are axially aligned with an axis 120. Two laterally extending portions 122 and 124 extend outwardly away from the axis 120. Located generally along the axis 120 are various gaps 126.

Figure 2:
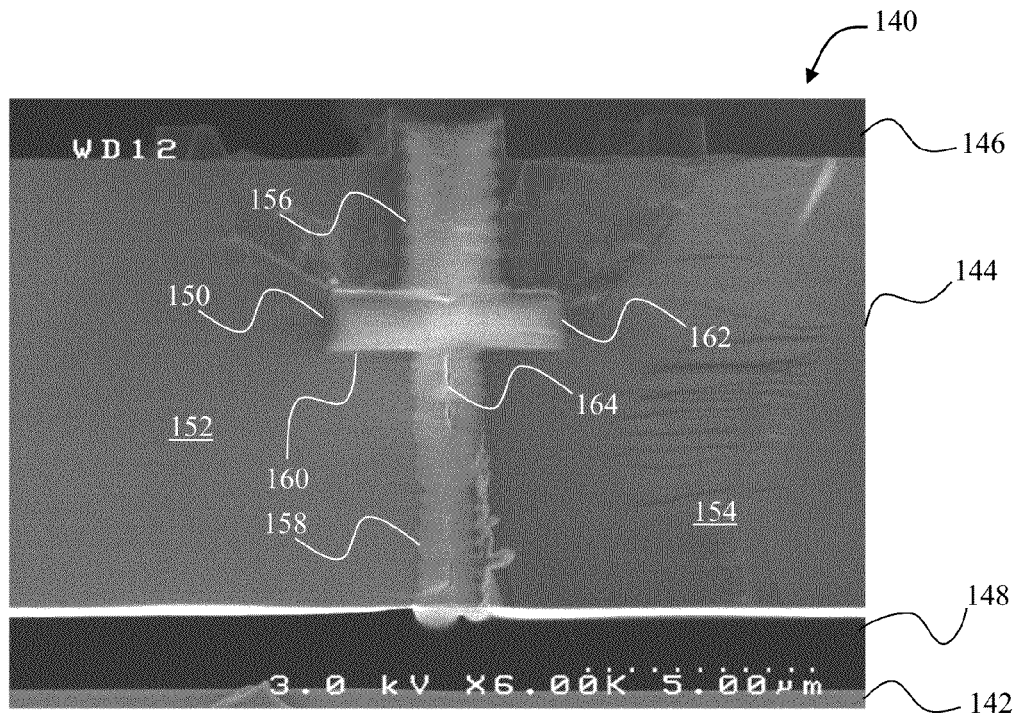
FIG. 2 is a surface electron microscope (SEM) microphotograph of a nitride spacer between adjacent segments of a layer, the nitride spacer having a laterally extending portion at a location between two trench portions in accordance with principles of the invention.

The gaps 126 are void areas in the nitride spacer 108 that result from the process used to form the spacer 108. This phenomenon is visible in FIG. 2, which is a SEM photomicrograph of a wafer 140. The wafer 140 is similar to the wafer 100, including a substrate layer 142, and a device layer 144. The device layer 144 is a membrane with an air gap 146 above the device layer 144 and an air gap 148 between the substrate layer 142 and the device layer 144. A spacer 150 separates the device layer 144 into adjacent membrane segments 152 and 154. The spacer 150 provides electrical isolation within an otherwise continuous membrane.

The spacer 150 includes an upper trench portion 156 which in this embodiment extends into the air gap 146, a lower trench portion 158, and two laterally extending portions 160 and 162. Gaps 164 can be seen at about the centerline of the lower trench portion 158. The upper trench portion 156, however, does not indicate a significant amount of gap formation. One reason for this is that the upper trench portion 156 is visibly wider than the lower trench portion 158. Thus, for some deposition techniques, as the width of a trench decreases for a given aspect ratio, the potential for gap formation increases. This phenomenon is discussed more fully with reference to FIGS. 3-10.

Figure 3:
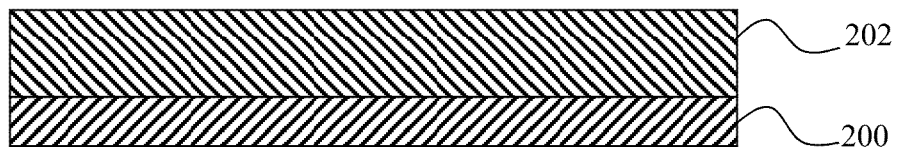
FIGS. 3-10 depict a procedure which can be used to form a nitride spacer between adjacent segments of a layer, the nitride spacer having a laterally extending portion at a location between two trench portions.
Figure 4:
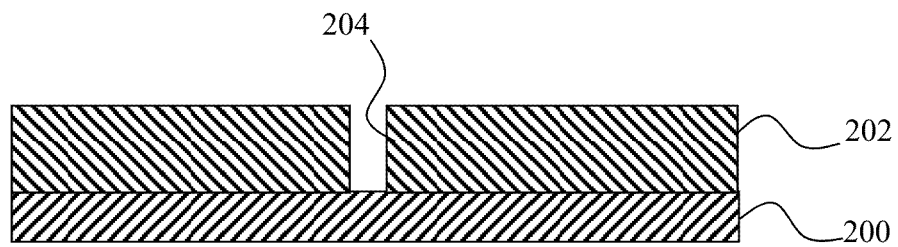

FIGS. 3-10 depict a process for forming a spacer in a wafer. Initially, a substrate layer 200 is provided and a lower device layer portion 202 is formed on the substrate layer 200 (FIG. 3). The lower device layer portion 202 is then etched to form a trench 204 which is depicted in FIG. 4. The trench 204 may be a high aspect ratio trench formed using any desired technique. In one embodiment, the trench 204 is formed using deep reactive ion etching (DRIE).

Figure 5:
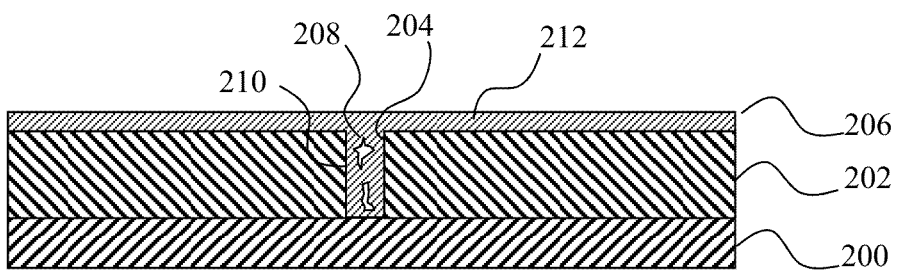

Next, as depicted in FIG. 5, a nitride layer 206 is formed on the exposed portions of the device layer 200 and the substrate layer 202. As the nitride layer is deposited, the nitride material "grows" from each exposed surface. Within the trench 204, the growth rate may not be uniform along the sidewalls of the trench 204, particularly if the trench 204 is relatively narrow. Accordingly, the nitride material from opposing sides of the trench at a first height may connect before nitride material from opposing sides of the trench at a lower height connect, thereby isolating a void area at a height below the first height. This results in gaps 208 in the lower trench portion 210 of the nitride layer 206.

Because the nitride grows outwardly from the sidewalls (lateral growth), the gaps 208 are generally close to the centerline of the trench 204. A laterally extending portion 212 of the nitride layer 206 which is directly above the upper surface of the device layer 202, however, is typically free of any significant gaps since the growth is primarily upward growth. Likewise, the laterally extending portion 212 above the trench 204 is filled primarily by upward growth once the trench 204 has been closed. Moreover, the upper portion of the lower trench portion 210 is filled primarily by upward growth. Thus, while a slight depression may be developed directly above the trench 204, the nitride layer 206 directly above the trench 204 and the upper portion of the trench portion 210 are typically free of any significant gaps. The depression, if any may be removed by CMP.

Figure 6:
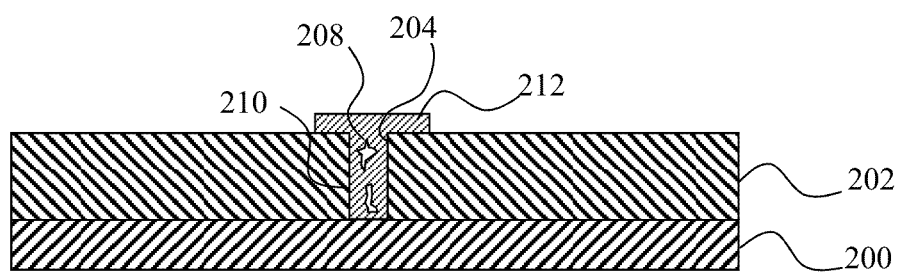
Figure 7:
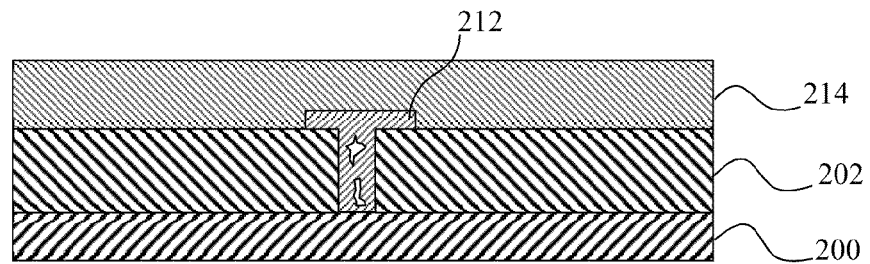
Figure 8:
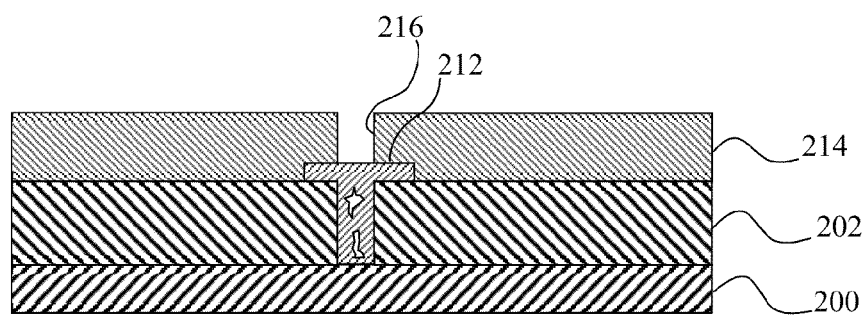

Referring now to FIG. 6, the laterally extending portion 212 is then etched to a desired shape. The shape may be selected based upon the desired final configuration of the spacer. Once the laterally extending portion 212 is in the desired shape, an upper device layer portion 214 is formed on the exposed upper surface of the lower device layer portion 202 and on the upper surface of the laterally extending portion 212 (see FIG. 7). In FIG. 7, the upper device layer portion 214 is depicted differently from the lower device portion 202 for ease of discussion. In this embodiment, however, both materials are identical such that the upper device layer portion 214 and the lower device layer portion 202 form a single integrated layer of material such as silicon. The upper device layer portion 214 is then planarized and, referring to FIG. 8, a trench 216 is etched through the upper device layer 214 to the laterally extending portion 212.

Figure 9:
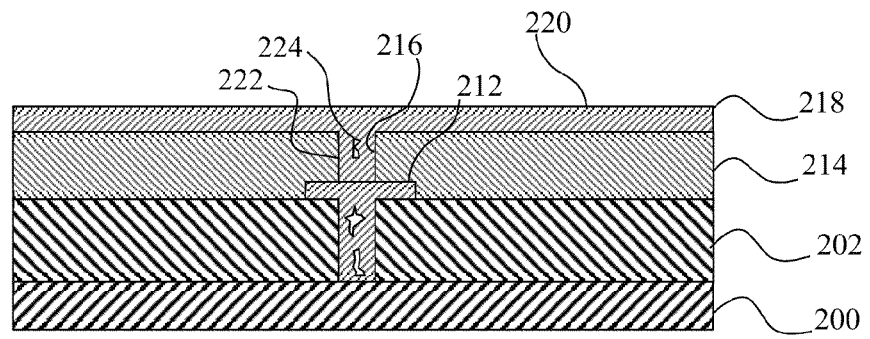

Next, as depicted in FIG. 9, a nitride layer 218 is formed on the exposed portions of the upper device layer portion 214 and the laterally extending portion 212. In alternative embodiments, the layer 218 is a type of material different from the layer 206. The nitride layer 218 includes a laterally extending portion 220 and an upper trench portion 222. In FIG. 9, the laterally extending portion 220 and the upper trench portion 222 are depicted differently for ease of discussion. In this embodiment, both materials are identical such that the upper trench portion 222 and the laterally extending portion 220 form a single integrated nitride structure.

In the same manner discussed above with respect to the lower trench portion 210, gaps 224 are formed in the upper trench portion 222, but not within the laterally extending portion 220 or the upper portion of the trench portion 222. Thus, after removing the laterally extending portion 220, the configuration of FIG. 10 is realized.

Figure 10:
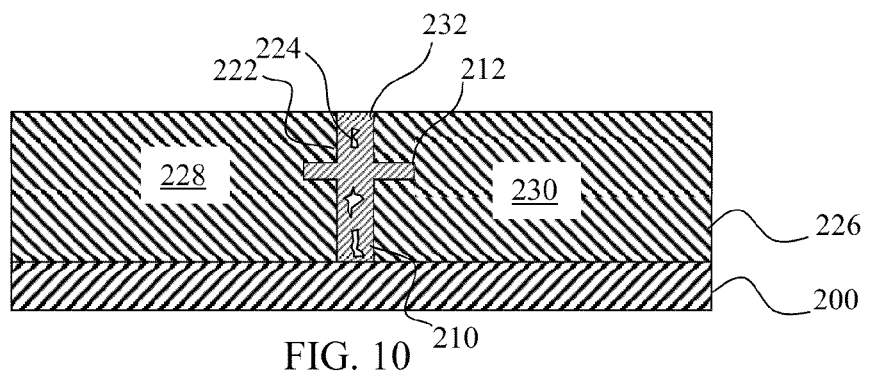

In FIG. 10, a device layer 226 includes two adjacent layer segments 228 and 230. The layer segments 228 and 230 are separated by a nitride spacer 232. While gaps including gap 224 are present within the nitride spacer 232, the upper surface and lower surface of the spacer 232 are free of gaps. Additionally, a laterally extending portion 212 which is positioned between the upper trench portion 222 and the lower trench portion 210 is free of gaps. The laterally extending portion 212 extends laterally beyond the outer edges of both the upper trench portion 222 and the lower trench portion 210. Thus, the laterally extending portion 212 provides increased strength and isolation capability.

Figure 11:
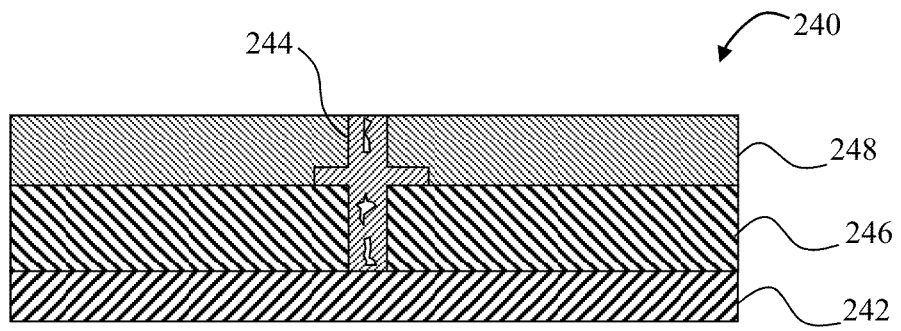
FIG. 11 depicts a side cross sectional view of a nitride spacer between adjacent segments of a layer, the nitride spacer having a laterally extending portion at a location between two trench portions, each of the trench portions in a different type of material.

Those of skill in the art will recognize that the process described with reference to FIGS. 3-10 may be modified in order to provide a variety of spacer configurations. One such configuration is depicted in FIG. 11 wherein a wafer 240 includes a substrate 242 and a spacer 244. While the substrate 242 and spacer 244 may be substantially identical to the substrate 200 and spacer 232 of FIG. 10, the wafer 240 further includes a lower layer portion 246 and an upper layer portion 248 which are formed from different types of material.

Figure 12:
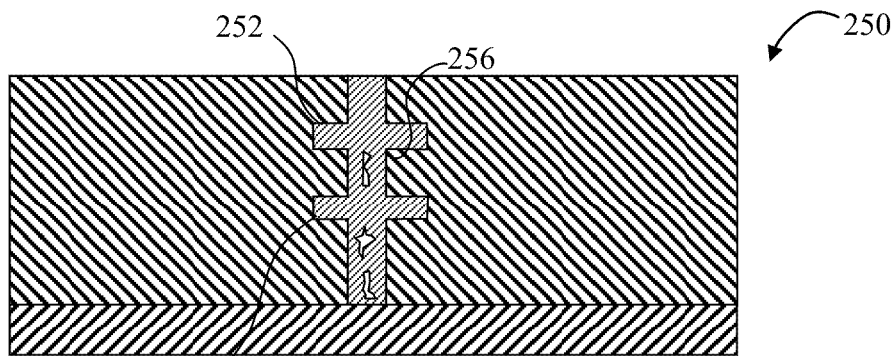
FIG. 12 depicts a side cross sectional view of a nitride spacer between adjacent segments of a layer, the nitride spacer having two laterally extending portions separated by a middle trench portion with additional trench portions extending above and below a respective one of the two laterally extending portions.

In a further embodiment, a spacer 250 may be formed with two laterally extending portions 252 and 254 as depicted in FIG. 12. The laterally extending portions 252 and 254 are separated by a middle trench portion 256.

Figure 13:
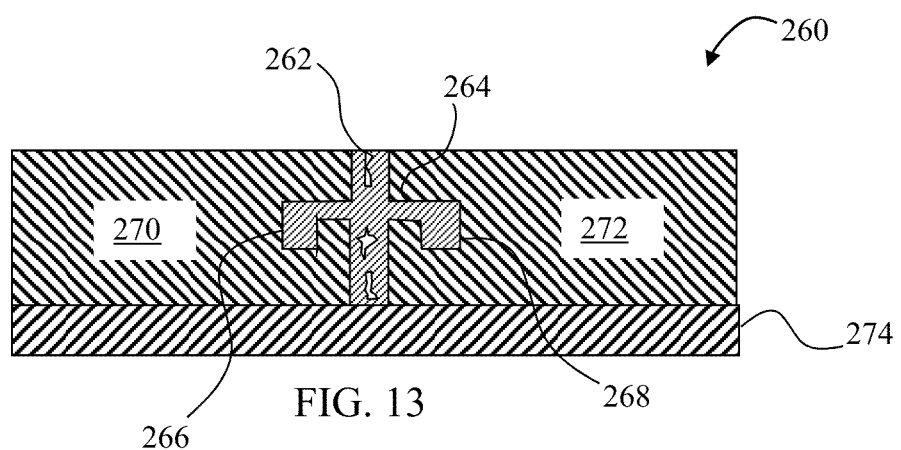
FIG. 13 depicts a side cross sectional view of a nitride spacer between adjacent segments of a layer, the nitride spacer having a laterally extending portion at a location between two trench portions, and two hook portions extending downwardly from the outer end portions of the laterally extending portion.

Another embodiment is depicted in FIG. 13. The wafer 260 of FIG. 13 includes a spacer 262 with a laterally extending portion 264. Two hook portions 266 and 268 of the spacer 262 extend downwardly from the laterally extending portion 264. The hook portions 266 and 268 may be formed by etching shallow trenches prior to deposition of the nitride layer used to form the laterally extending portion 264. The hook portions 266 and 268 provide increased mechanical strength for resisting lateral movement of layer segments 270 and 272 away from each other. Additional strength may be realized by forming the spacer 262 partially within the substrate layer 274 and/or a cap layer (not shown).

Figure 14:
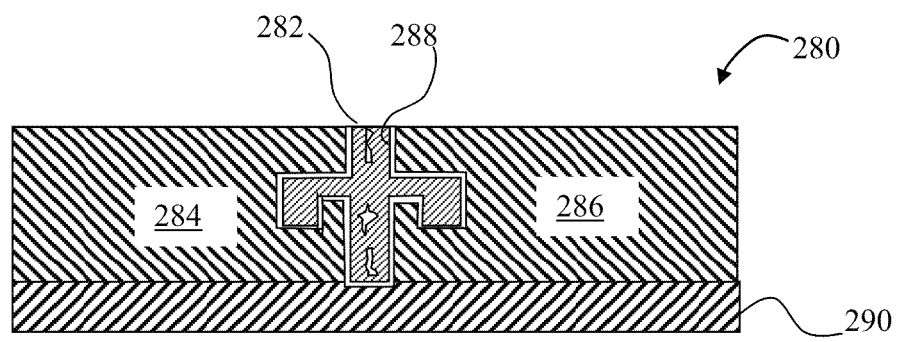
FIG. 14 depicts a side cross sectional view of a released nitride spacer between adjacent segments of a layer, the nitride spacer having a laterally extending portion at a location between two trench portions, and two hook portions extending downwardly from the outer end portions of the laterally extending portion.

Referring to FIG. 14, a wafer 280 includes a spacer 282 which allows for movement of adjacent layer segments 284 and 286. The spacer in FIG. 14 is released from the layer segments 284 and 286 such as by use of a sacrificial coating which is later etched, resulting in a gap 288 between the spacer 282 and the layer segments 284 and 286. The spacer 282 thus provides stress isolation between the layer segments 284 and 286. By using a sacrificial layer between the layer segments 284 and 286 and the substrate 290, the layer segments 284 and 286 may be released while the spacer 282 movably interlocks the layer segments 284 and 286. If desired, the spacer 282 may be partially formed within the substrate 290 and/or a cap layer (not shown), thereby anchoring the spacer 282 while allowing controlled movement of the layer segments 284 and 286.

Figure 15:
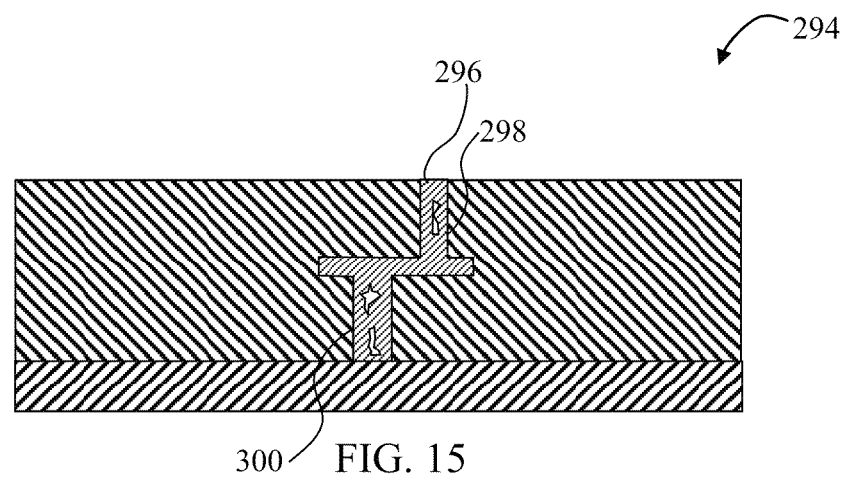
FIG. 15 depicts a side cross sectional view of a nitride spacer between adjacent segments of a layer, the nitride spacer having a laterally extending portion at a location between two trench portions, the two trench portions axially offset from each other.

In addition the foregoing arrangements, each of which may be combined with one or more aspects of the other arrangements, depending upon the desired application, the orientation and sizes of the spacer components may also be varied. Thus, an upper trench may be shorter, taller, narrower, or wider than a lower trench. The laterally extending portion in a particular embodiment may be wider and/or thicker than a laterally extending portion in another embodiment. Moreover, while the trench portions in the preceding embodiments have been shown as aligned with each other, the trench portions may be laterally offset. For example, the wafer 294 of FIG. 15 includes a spacer 296 with an upper trench portion 298 that defines a longitudinal axis that is laterally offset from a longitudinal axis defined by a lower trench portion 300.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A wafer, comprising:
a base layer;
a first conductive layer portion of a finally constructed wafer located above an upper surface of the base layer;
a first trench in the first conductive layer portion;
a first insulating material portion of the finally constructed wafer located within the first trench;
a second insulating material portion extending horizontally above an upper surface of the first conductive layer portion and connected to the first insulating material portion;
a second conductive layer portion above an upper surface of the second insulating material portion;
a second trench in the second conductive layer portion;
a third insulating material portion within the second trench and on the upper surface of the second insulating material portion;
a fourth trench in the first conductive layer portion; and
a sixth insulating material portion within the fourth trench, wherein the second insulating material portion above an upper surface of the first layer portion extends from the first insulating material portion to the sixth insulating material portion, wherein:
the first insulating material portion is not adhered to the first conductive layer portion;
the sixth insulating material portion is not adhered to the first conductive layer portion; and
the second insulating material portion is not adhered to the upper surface of the first conductive layer portion.

2. The wafer of claim 1, wherein the second insulating material portion extends outwardly of the first insulating material portion on opposite sides of the first insulating material portion.

3. The wafer of claim 1, wherein the third insulating material portion is axially aligned with the first insulating material portion.

4. The wafer of claim 1, wherein:
the first insulating material portion comprises a first set of material characteristics;
the third insulating material portion comprises a second set of material characteristics; and
the first set of material characteristics is different from the second set of material characteristics.

5. The wafer of claim 1, wherein:
the first conductive layer portion comprises a third set of material characteristics;
the second conductive layer portion comprises a fourth set of material characteristics; and
the third set of material characteristics is different from the fourth set of material characteristics.

6. The wafer of claim 1, further comprising:
a fourth insulating material portion above an upper surface of the second conductive layer portion;
a top layer above an upper surface of the fourth insulating material portion;
a third trench in the top layer; and
a fifth insulating material portion within the third trench and on the upper surface of the fourth insulating material portion.

7. The wafer of claim 1, wherein the fourth trench extends only partially through the first conductive layer portion.

8. The wafer of claim 1, wherein the first insulating material portion is a silicon nitride insulating material portion.

9. A wafer, comprising:
a base layer;
a first layer portion above an upper surface of the base layer;
a first trench in the first layer portion;
a first insulating material portion within the first trench;
a second insulating material portion extending horizontally above an upper surface of the first layer portion and connected to the first insulating material portion;
a second layer portion above an upper surface of the second insulating material portion;
a second trench in the second layer portion;
a third insulating material portion within the second trench and on the upper surface of the second insulating material portion;
a third trench in the first layer portion; and
a fourth insulating material portion within the third trench, wherein the second insulating material portion above an upper surface of the first layer portion extends from the first insulating material portion to the fourth insulating material portion when the wafer is finally formed, wherein:

the first insulating material portion is not adhered to the first layer portion;

the fourth insulating material portion is not adhered to the first layer portion; and the second insulating material portion is not adhered to the upper surface of the first layer portion.

10. The wafer of claim 9, wherein the second insulating material portion extends outwardly of the first insulating material portion on opposite sides of the first insulating material portion.

11. The wafer of claim 9, wherein the third insulating material portion is axially aligned with the first insulating material portion.

12. The wafer of claim 9, wherein the third insulating material portion is axially offset from the first insulating material portion.

13. The wafer of claim 9, wherein:

the first insulating material portion comprises a first set of material characteristics;

the third insulating material portion comprises a second set of material characteristics; and the first set of material characteristics is different from the second set of material characteristics.

14. The wafer of claim 9, wherein:

the first layer portion comprises a third set of material characteristics;

the second layer portion comprises a fourth set of material characteristics; and the third set of material characteristics is different from the fourth set of material characteristics.

15. The wafer of claim 9, further comprising:

a fifth insulating material portion above an upper surface of the second layer portion;

a top layer above an upper surface of the fifth insulating material portion;

a fourth trench in the top layer; and a sixth insulating material portion within the fourth trench and on the upper surface of the fifth insulating material portion.

16. The wafer of claim 9, wherein the third trench extends only partially through the first layer portion.

17. The wafer of claim 9, wherein the first insulating material portion is a silicon nitride insulating material portion.

* * * * *